(12) United States Patent
Perera et al.

(10) Patent No.: US 9,105,748 B1
(45) Date of Patent: Aug. 11, 2015

(54) INTEGRATION OF A NON-VOLATILE MEMORY (NVM) CELL AND A LOGIC TRANSISTOR AND METHOD THEREFOR

(71) Applicants: Asanga H. Perera, Austin, TX (US); Craig T. Swift, Austin, TX (US)

(72) Inventors: Asanga H. Perera, Austin, TX (US); Craig T. Swift, Austin, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/480,017

(22) Filed: Sep. 8, 2014

(51) Int. Cl.
  *H01L 27/115* (2006.01)
  *H01L 21/8239* (2006.01)

(52) U.S. Cl.
  CPC ...... *H01L 21/8239* (2013.01); *H01L 27/11521* (2013.01)

(58) Field of Classification Search
  CPC ............ H01L 29/66825; H01L 27/115; H01L 27/11521; H01L 27/11568; H01L 21/28273
  USPC .................................. 438/588, 283; 257/314
  See application file for complete search history.

(56) References Cited

U.S. PATENT DOCUMENTS

| 8,154,075 B2 * | 4/2012 | Nakagawa ..................... 257/331 |
| 8,680,597 B2 | 3/2014 | Chuang et al. |
| 2013/0228878 A1 | 9/2013 | Wang et al. |
| 2013/0309834 A1 | 11/2013 | Hsieh et al. |
| 2015/0054044 A1 * | 2/2015 | Perera et al. ................... 257/314 |

* cited by examiner

*Primary Examiner* — Monica D Harrison

(57) ABSTRACT

A method of making a split gate non-volatile memory (NVM) using a substrate includes etching a recess into an isolation region of an NVM region of the substrate and depositing a conductive layer and a capping layer. A select gate and a control gate are formed in the NVM region, and a dummy gate is formed in a logic region of the substrate. A portion of the capping layer is removed and a salicide block bi-layer is deposited and patterned to form a first opening that exposes a contact portion of the conductive layer over the recess. A silicided region is formed on the contact portion. The substrate is planarized to expose the dummy gate, which is replaced with a metal gate. A second opening is etched through a first interlayer dielectric deposited over the substrate to the silicided region. Contact metal is deposited into the second opening.

20 Claims, 20 Drawing Sheets

INTEGRATION OF A NON-VOLATILE MEMORY (NVM) CELL AND A LOGIC TRANSISTOR AND METHOD THEREFOR

BACKGROUND

1. Field

This disclosure relates generally to semiconductor manufacturing, and more specifically, to the integration of logic transistors and NVM cells.

2. Related Art

Non-volatile memories (NVMs) are often formed on an integrated circuit which also performs other functions. In such cases it is undesirable to sacrifice logic performance in favor of performance of the NVM. Also, it is important to avoid or minimize additional cost in achieving high performance for both the logic and the NVM. Gate last, which is a technique for enhancing performance by using a dummy gate on, typically, thermal oxide for the formation of source/drains and then replacing the dummy gate and thermal oxide with a higher performance gate or gate stack and gate dielectric has shown promise or by forming the higher performance gate dielectric relatively early in the process with the high performance gate or gate stack replacing a dummy gate formed over the higher performance gate dielectric. The higher performance gate will typically have higher conductance and an optimized work function. The higher performance gate dielectric will typically have a higher dielectric constant (k) than oxide.

Accordingly there is a need to provide further improvement in achieving high performance while also addressing cost increase issues in integrated circuits that have both NVM and logic, particularly in the context of gate last.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, an NVM cell in an NVM region is integrated on the same integrated circuit with a logic transistor. The NVM cell has a select gate and a control gate. The select gate is connected to the world line. The connection between the word line and the select gate is made in a location over an isolation region where the isolation region has a recess. The select gate follows the recess so the select gate effectively has the same recess. A via will connect the word line to a silicided portion of the select gate in the recessed region. A subsequent step of chemical mechanical polishing (CMP) is able to provide access to a dummy gate in a logic region of the integrated circuit while, due to the recess, the silicided portion of the select gate is below the height of the dummy gate. The dummy gate is replaced by a metal gate after the CMP. After the word line is connected to the select gate, using a via located in the silicided portion of the select gate, the word line is contacted to a subsequent metal layer with a via through an interlayer dielectric over the word line. This is better understood by reference to the drawings and the following written description.

The semiconductor substrate described herein can be any semiconductor material or combinations of materials, such as gallium arsenide, silicon germanium, silicon-on-insulator (SOI), silicon, monocrystalline silicon, the like, and combinations of the above.

Figure 1:
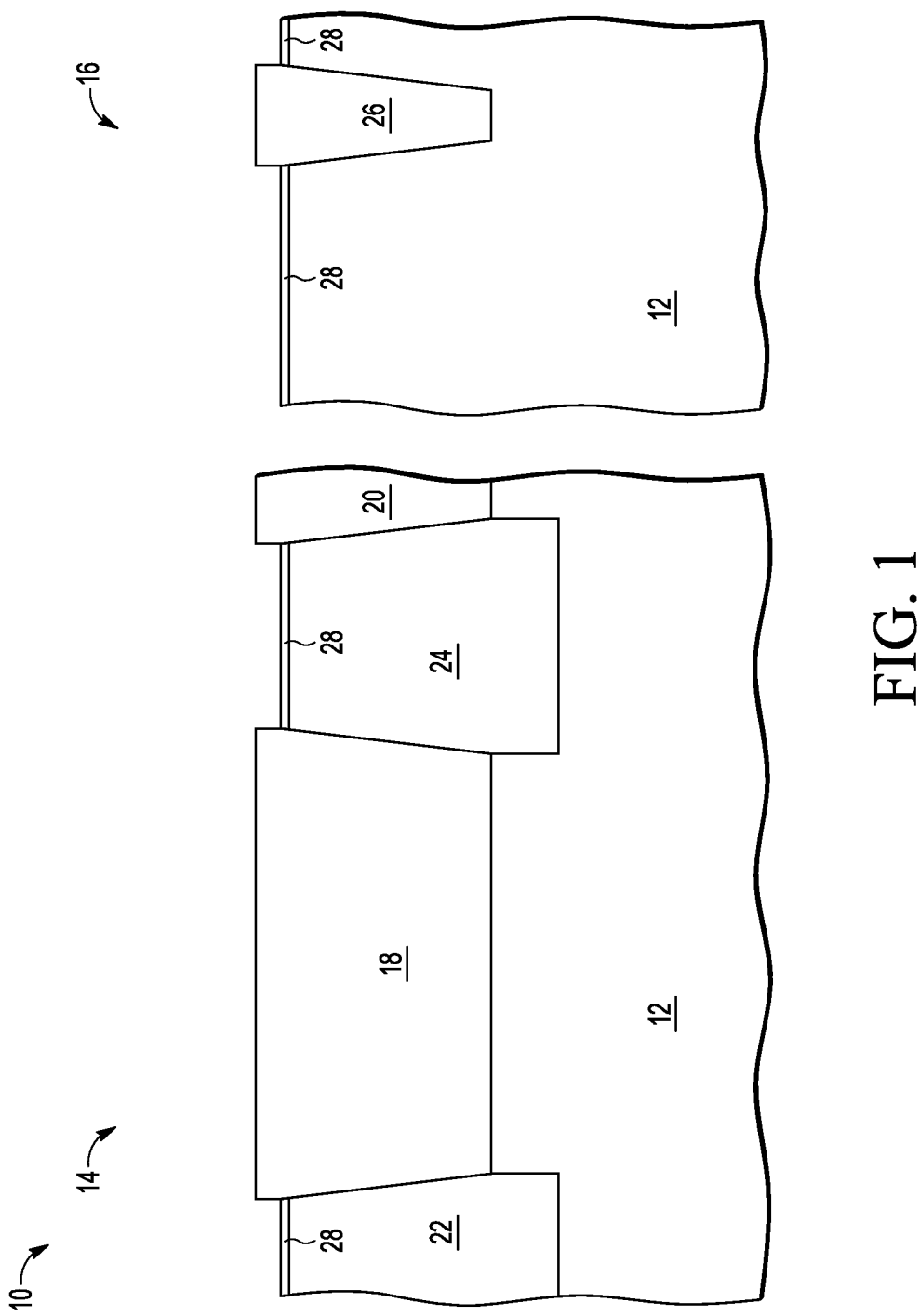
FIG. 1 is a cross section of a non-volatile memory cell and a gate last transistor at a stage in processing.

Shown in FIG. 1 is a semiconductor device 10 having an NVM region 14 and a logic region 16 with a substrate 12. In substrate 12, NVM region 14 has an isolation region 18, a well region 22 on one side of isolation region 18, a well region 24 on an opposing side of isolation region 18, an isolation region 20 on an opposing side of well region 24, and a dielectric layer 28 over well regions 22 and 24. In substrate 12, logic region 16 has an isolation region 26 and dielectric layer 28 over substrate 12. Dielectric layer 28 may be grown and may be referenced as thermal oxide. As an alternative, dielectric layer 28 may be an oxynitride. The well regions for logic region 16 have not yet been formed. The depth of isolation regions 18 and 26 may be about 2500 to 3000. Well regions 22 and 24 may have a depth of about 4000 to 5000 Angstroms. Isolation regions 18 and 26 may extend about 100 Angstroms above the top surfaces of well regions 22 and 24 and substrate 12 shown in logic region 16.

Figure 2:
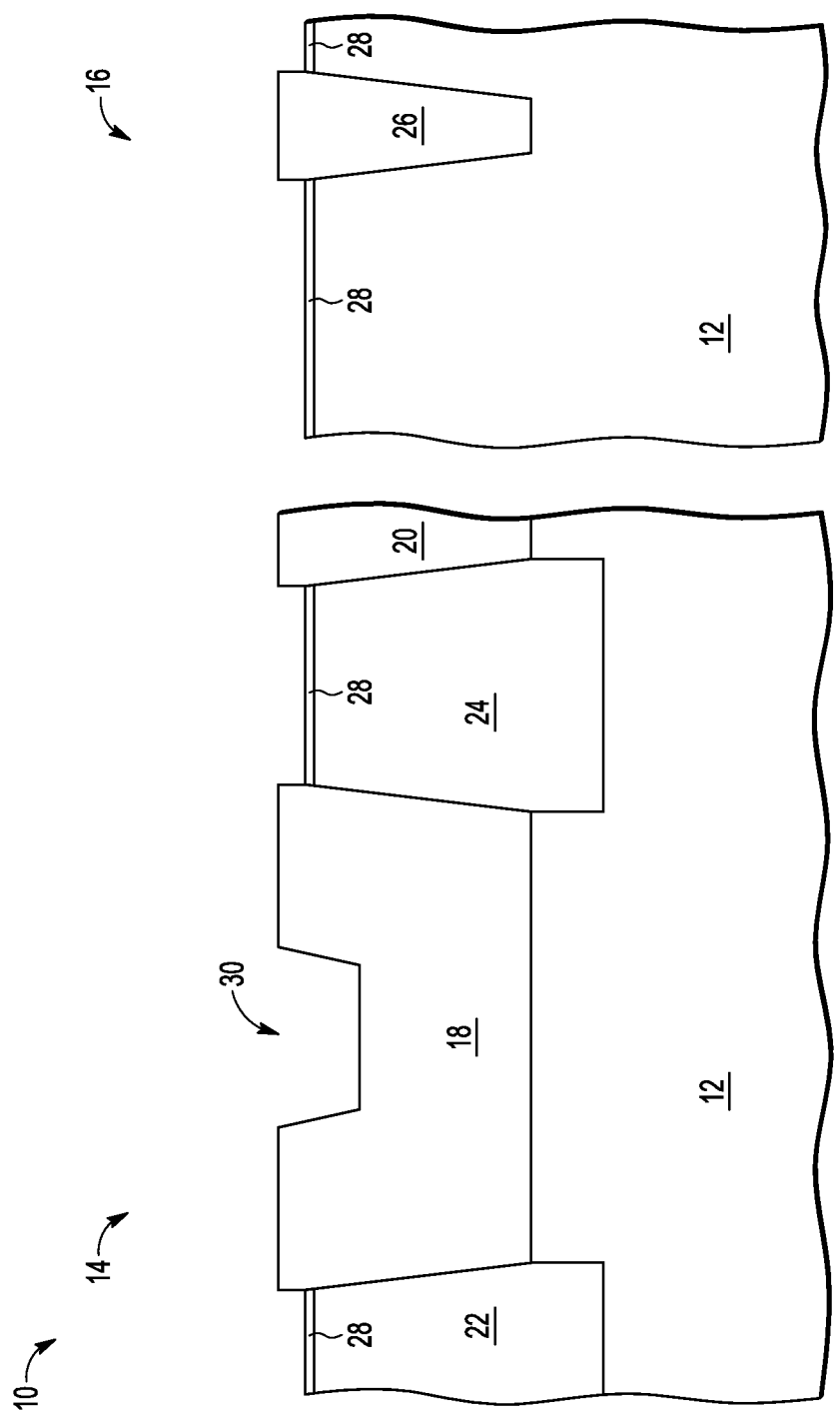
FIG. 2 is a cross section of a non-volatile memory cell and a gate last transistor of FIG. 1 at a subsequent stage in processing.

Shown in FIG. 2 is semiconductor device 10 after forming an opening 30 partially through isolation region 18 in a generally central area of isolation region 18. Opening 30 may have a depth of about 500 to 600 Angstroms and a width of about 5000 Angstroms. Opening 30 may be formed by a patterned etch in which areas other than opening 30 shown in FIG. 2 are covered by photoresist which includes dielectric layer 28.

Figure 3:
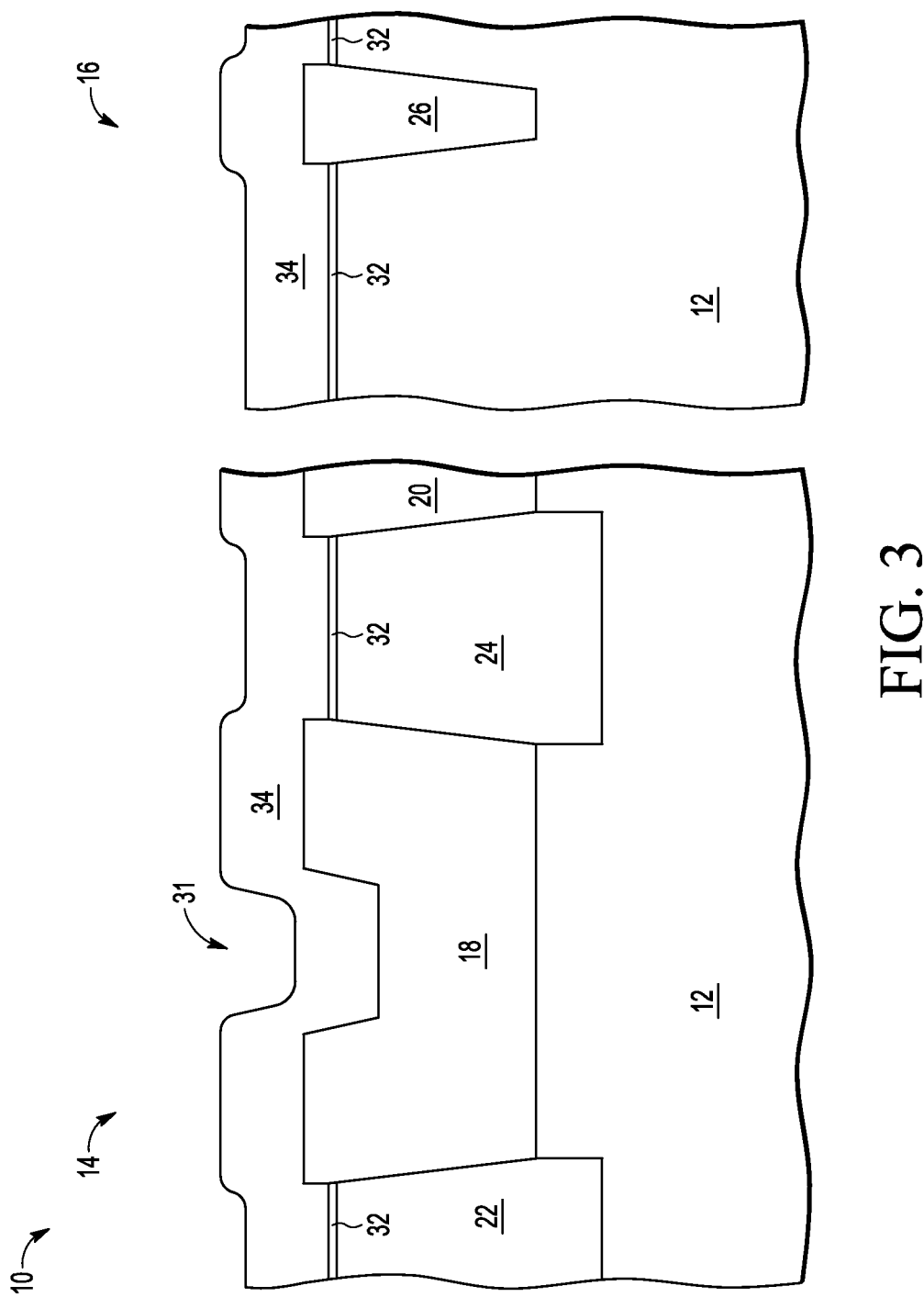
FIG. 3 is a cross section of a non-volatile memory cell and a gate last transistor of FIG. 2 at a subsequent stage in processing.

Shown in FIG. 3 is semiconductor device 10 after removing dielectric layer 28 and replacing it with a dielectric layer 32 and after depositing a polysilicon layer 34 over NVM region 14 and logic region 16. Dielectric layer 28, especially if it is thermal oxide, is not normally desirable as a gate dielectric after it has been contacted by photoresist. Dielectric layer 32 may be conveniently grown as thermal oxide. If dielectric layer 28 is oxynitride, it may not need to be removed and thus it would not be necessary to replace it. In these FIGs, it is shown as being replaced. Polysilicon layer 34 may have a thickness of about 600 Angstroms. Polysilicon layer 34 is conformal so that its thickness is substantially uniform and has an opening 31 of substantially the same depth as opening 30. Opening 31 has less width than opening 30.

Figure 4:
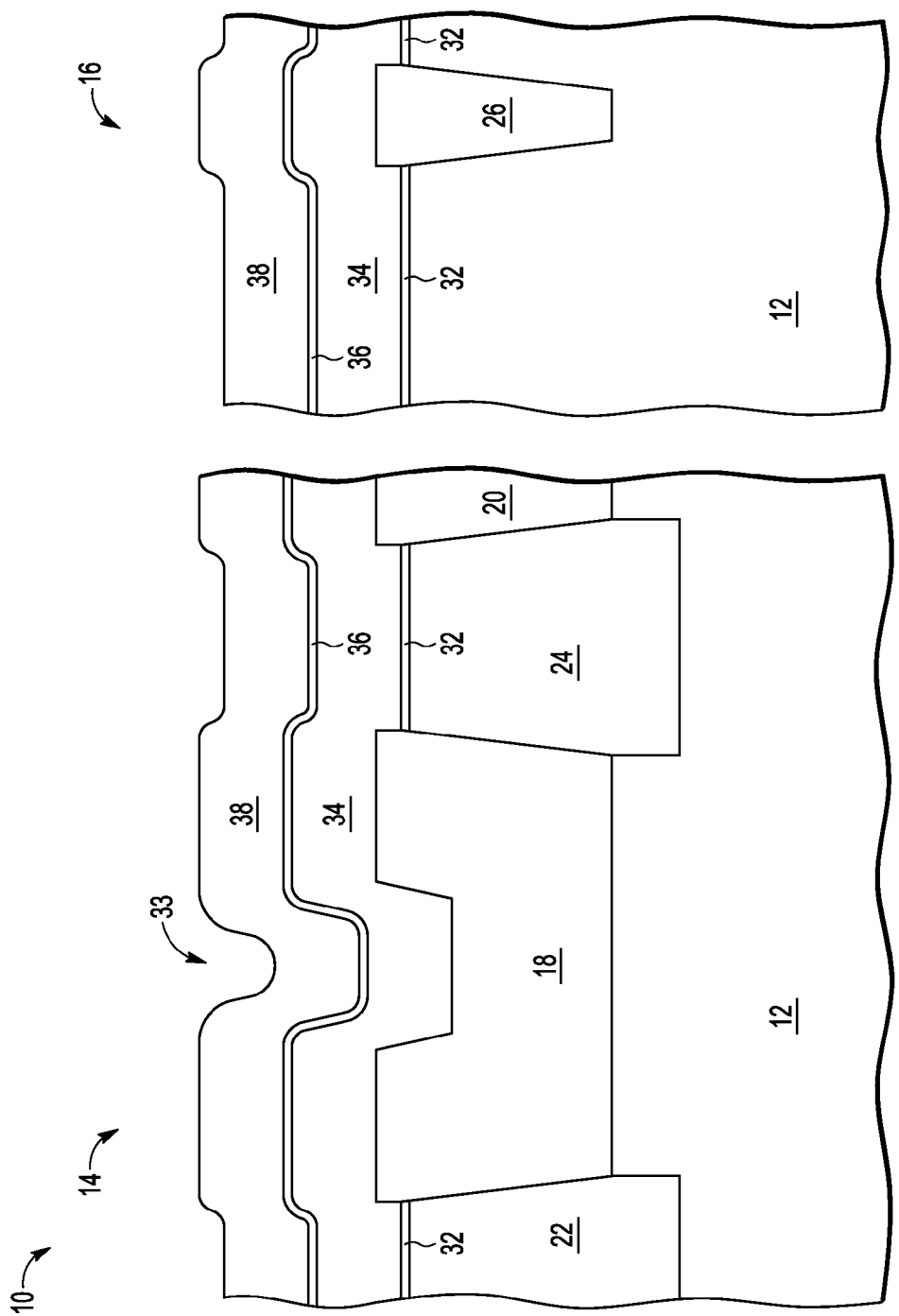
FIG. 4 is a cross section of a non-volatile memory cell and a gate last transistor of FIG. 3 at a subsequent stage in processing.

Shown in FIG. 4 is semiconductor device 10 after depositing a relatively thin oxide layer 36 over NVM region 14 and logic region 16 and then a nitride layer 38 of substantially the same thickness as that of polysilicon layer 34 over oxide layer 36. Nitride layer 38 is also deposited conformally resulting in an opening 33 aligned with openings 31 and 30. Opening 33 has less width and may have a little less depth as well compared to opening 31.

Figure 5:
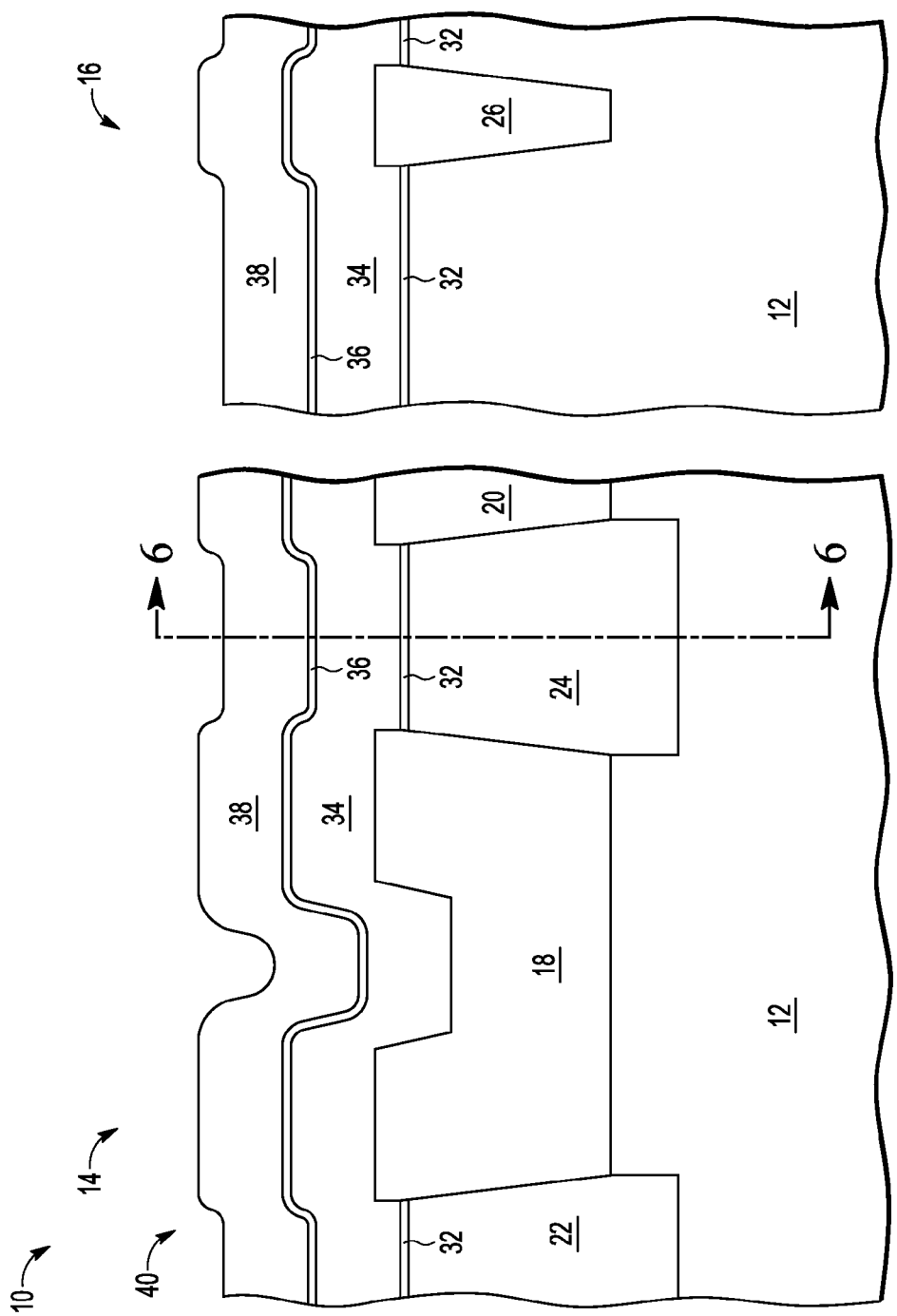
FIG. 5 is a cross section of a non-volatile memory cell and a gate last transistor of FIG. 4 at a subsequent stage in processing.

Shown in FIG. 5 is semiconductor device 10 after performing a patterned etch of nitride layer 38, oxide layer 36, polysilicon layer 34, and oxide layer 32 to form select gates of polysilicon layer 34 such as select gate 40 having overlying oxide layer 36 and nitride layer 38.

Figure 6:
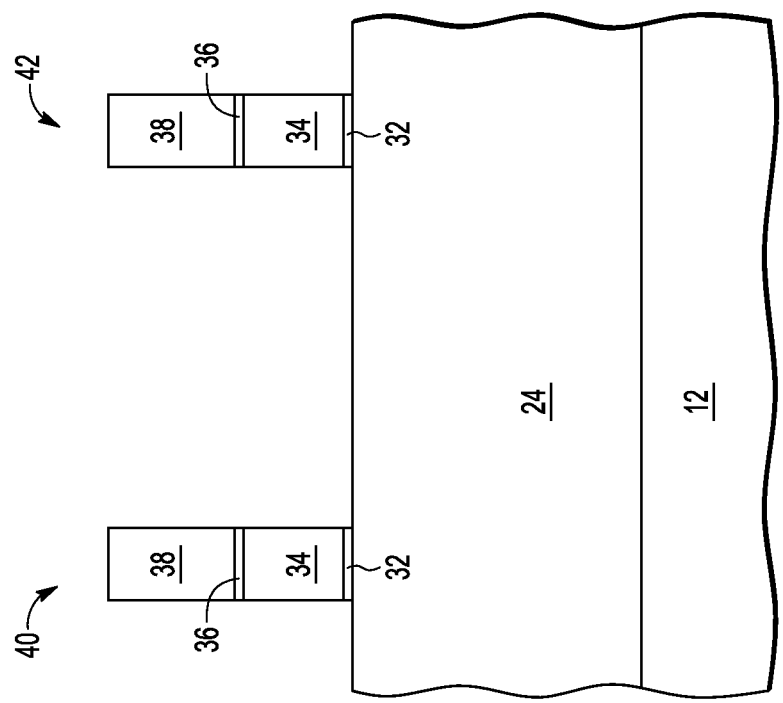
FIG. 6 is a different cross section of the non-volatile memory cell and a gate last transistor of FIG. 5.

Shown in FIG. 6 is semiconductor device 10 taken at cross section 6-6 shown in FIG. 5 showing select gate 40 and a select gate 42. Select gates 40 and 42 extend to multiple NVM cells. Select gates are commonly strapped to an overlying metal word line through vias.

Figure 7:
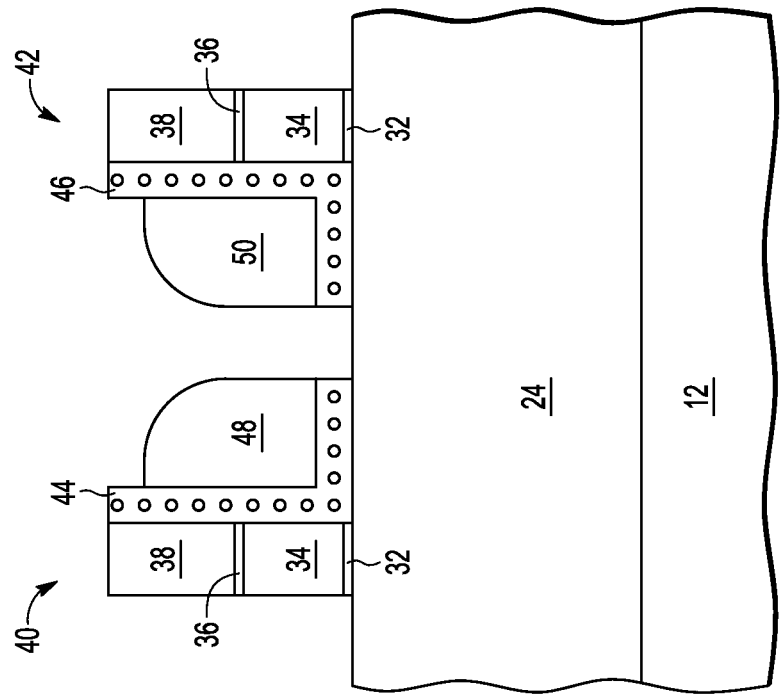
FIG. 7 is a cross section of a non-volatile memory cell and a gate last transistor of FIG. 6 at a subsequent stage in processing.

Shown in FIG. 7 is semiconductor device 10 after forming a blanket charge storage layer and patterning it to form charge storage layers 44 and 46 adjacent to select gates 40 and 42, respectively, and forming control gates 48 and 50 on charge storage layers 44 and 46, respectively, and separated from select gates 40 and 42, respectively, by the charge storage layers. Shown in FIG. 7 is the actual gate and charge storage structure of two NVM cells which is substantially replicated both along the direction of select gates 40 and 42 and laterally with further select gates. Source/drains in well 24, when formed, will result in structures that can be considered NVM cells. In this type of NVM cell structure, the read current is reversed from the program current so that the doped regions to be formed in well region 24 adjacent to select gates 40 and 42 and between control gates 48 and 50 may function as either as sources or drains, depending on the particular operation being performed.

Figure 8:
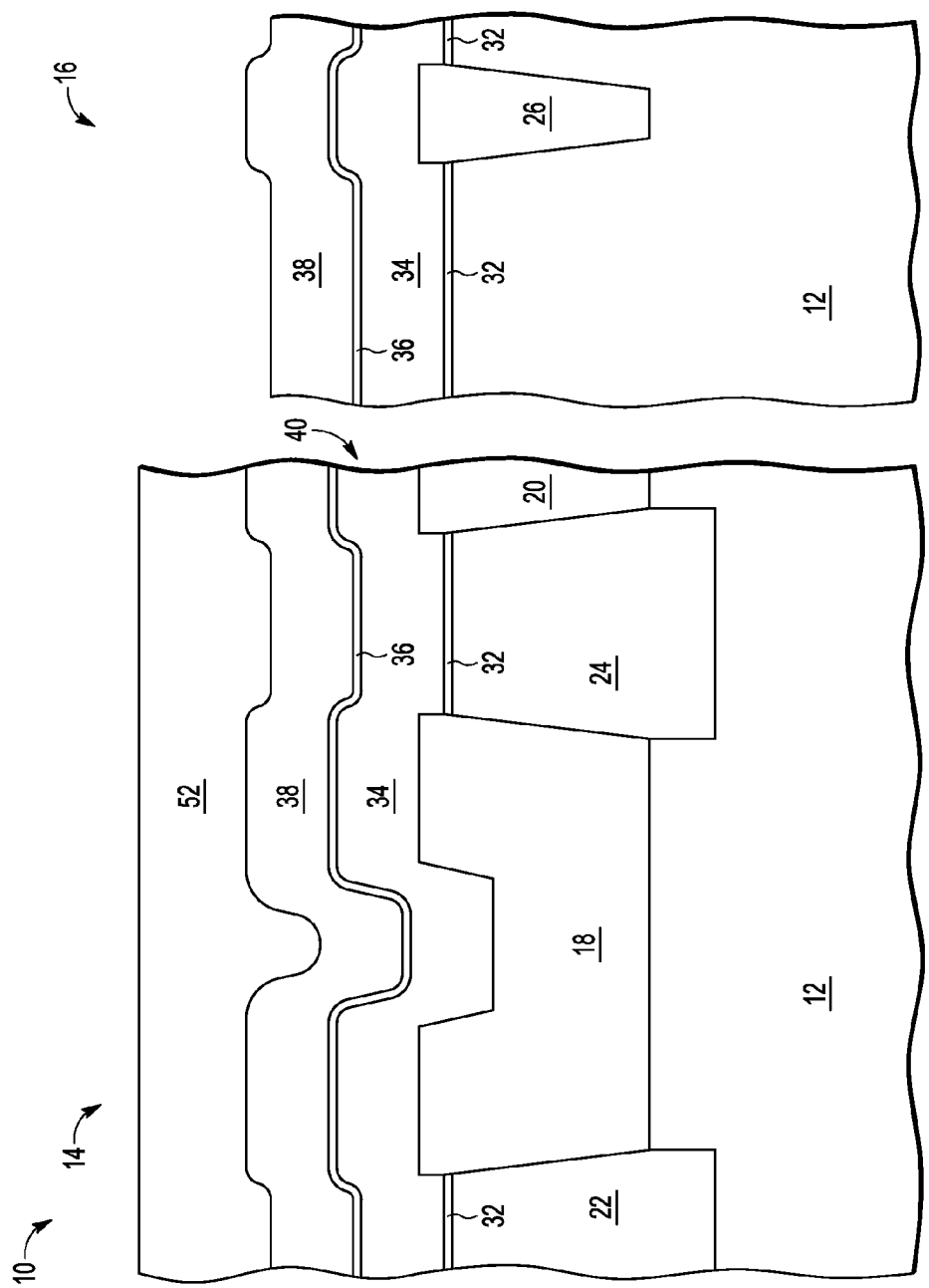
FIG. 8 is a cross section of a non-volatile memory cell and a gate last transistor of FIG. 7 at a subsequent stage in processing.

Shown in FIG. 8, which is the same cross sectional view as for FIGS. 1-5, is semiconductor device 10 after the processes described for FIGS. 6 and 7 and after forming a protective layer 52 over NVM region 14 to protect NVM region 14 during processing of logic region 16. Protective layer 52 may be a single layer or multiple layers such as an oxide/nitride/polysilicon stack. The thickness of protective layer 52 may be thicker than either polysilicon layer 34 or nitride layer 38. When forming a layer, such as protective layer 52, over one region but not the other, it should be understood that the layer is formed over both regions and then removed from one region with a patterned etch.

Figure 9:
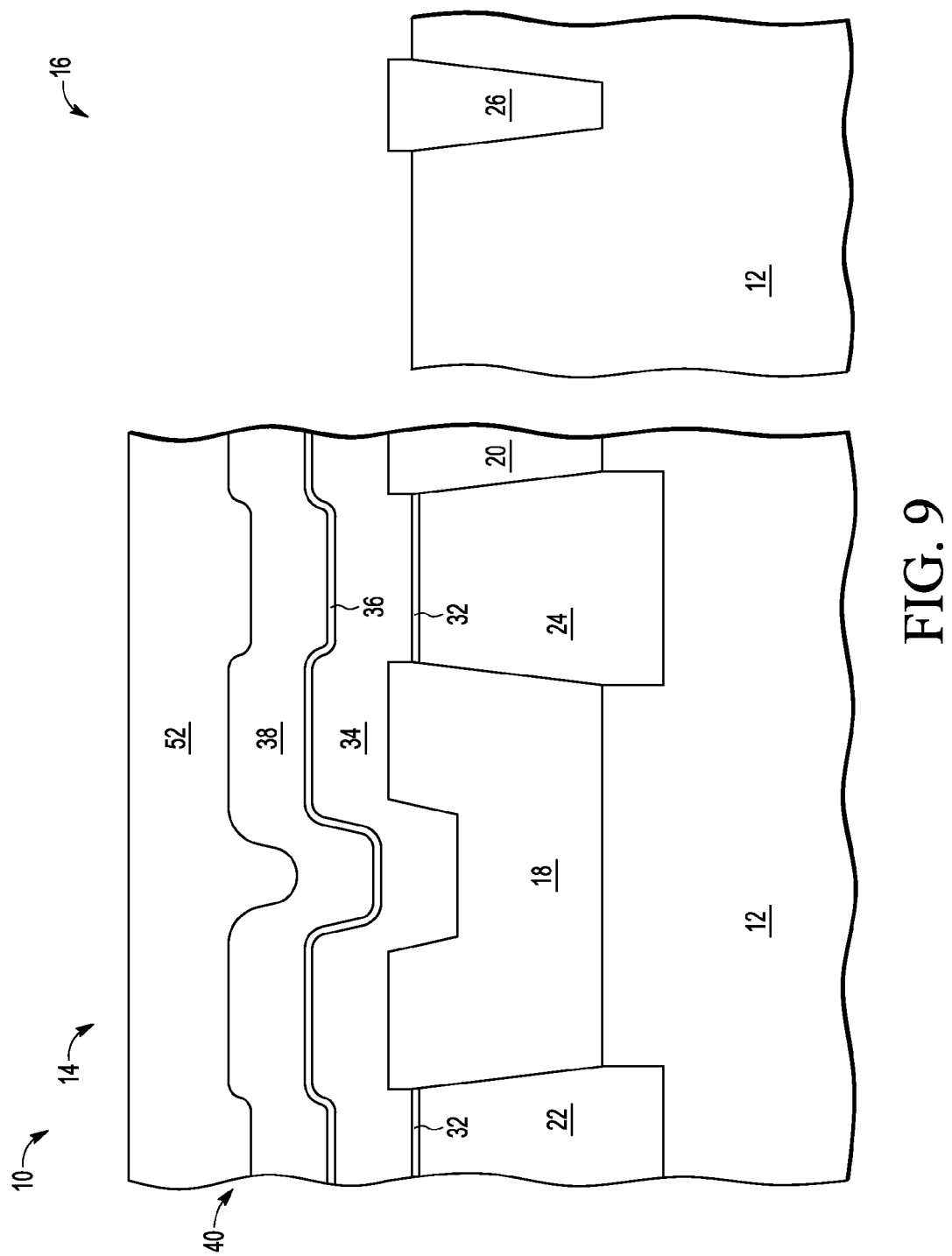
FIG. 9 is a cross section of a non-volatile memory cell and a gate last transistor of FIG. 8 at a subsequent stage in processing.

Shown in FIG. 9 is semiconductor device 10 after removing nitride layer 38, oxide layer 36, polysilicon layer 34, and oxide layer 32 from logic region 16.

Figure 10:
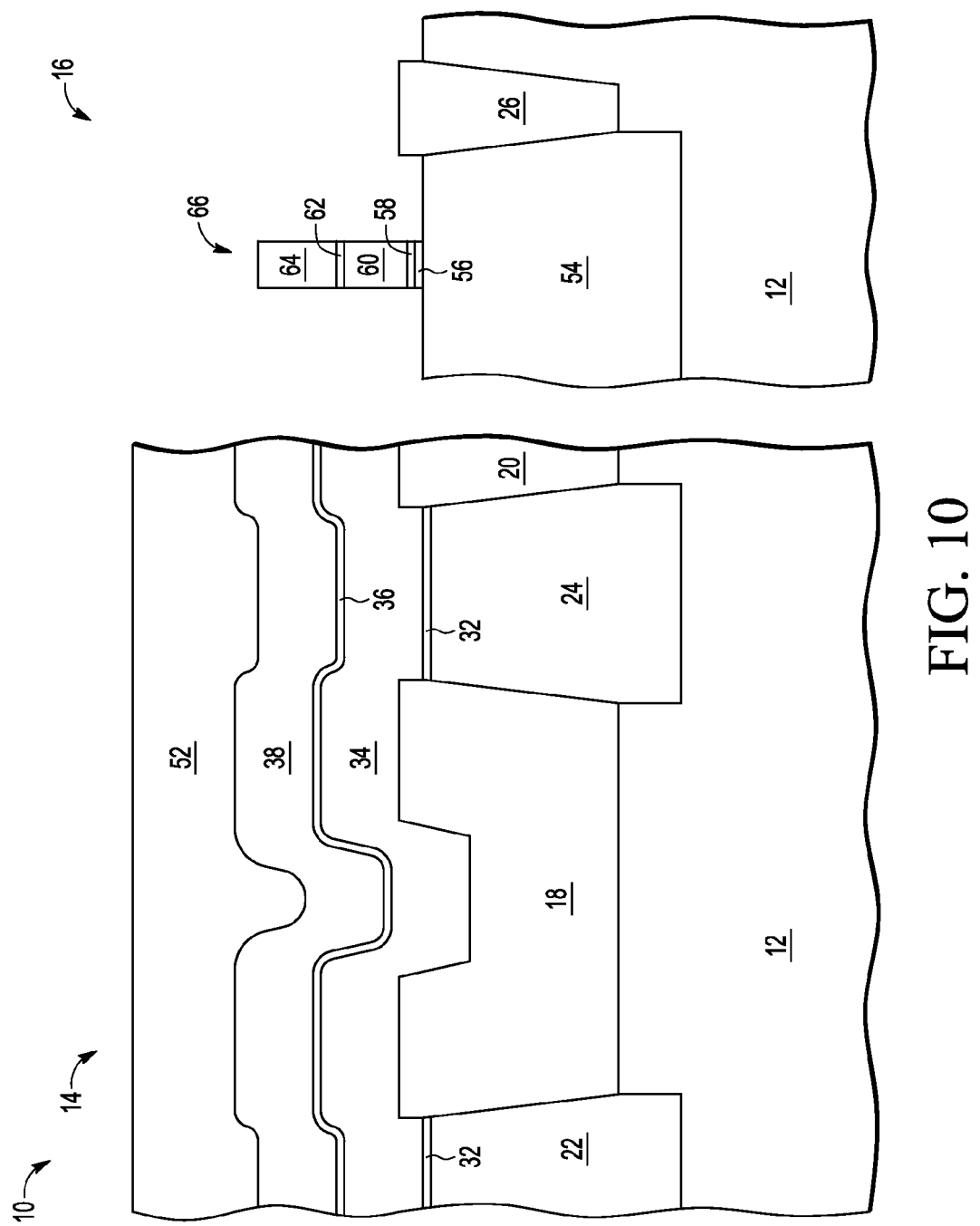
FIG. 10 is a cross section of a non-volatile memory cell and a gate last transistor of FIG. 9 at a subsequent stage in processing.

Shown in FIG. 10 is semiconductor device 10 after forming a well 54 in substrate 12 in logic region 16 abutting and extending below isolation region 26 and forming a dummy stack 66 having a desired width for forming a gate for a logic transistor. Formed in order are a gate dielectric layer 56, which may be a high k dielectric, on well 54; a barrier layer 58 on gate dielectric layer 56, which may be metallic such as a nitride of a refractory metal; a polysilicon layer 60 having a thickness similar to that of polysilicon layer 34, a relatively thin oxide layer 62, and a nitride layer 64 having a thickness similar to nitride layer 38. These layers are pattern etched so that dummy stack 66 has a width consistent with the width desired for the gate of a logic transistor to be formed. Dummy stack 66 has a height about the same as the height of the top surface of nitride layer 38 shown in FIG. 10.

Figure 11:
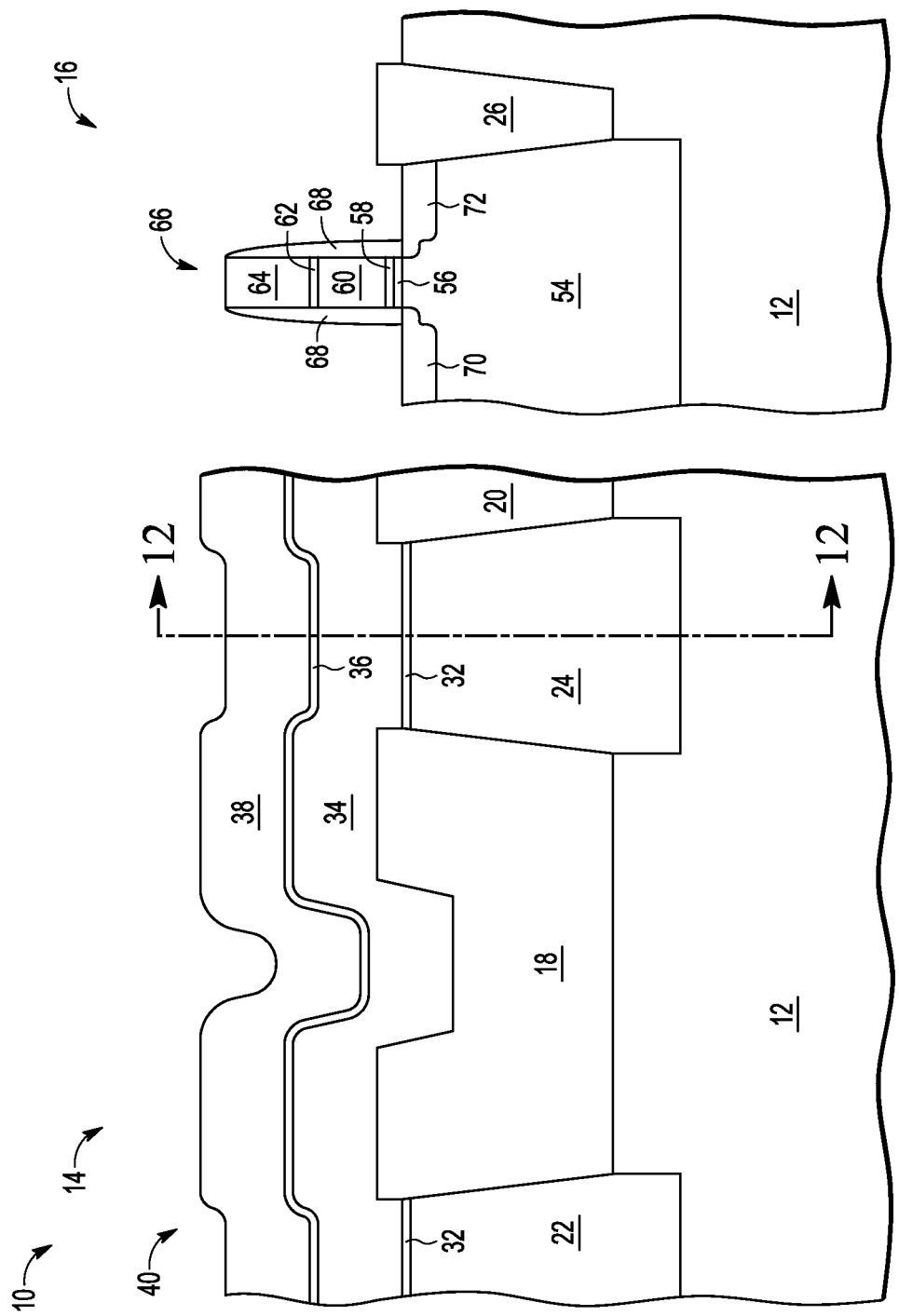
FIG. 11 is a cross section of a non-volatile memory cell and a gate last transistor of FIG. 10 at a subsequent stage in processing.

Shown in FIG. 11 is semiconductor device 10 after removing protective layer 52 from NVM region 14 and forming sidewall spacer 68 and source/drains 70 and 72 for dummy stack 66.

Figure 12:
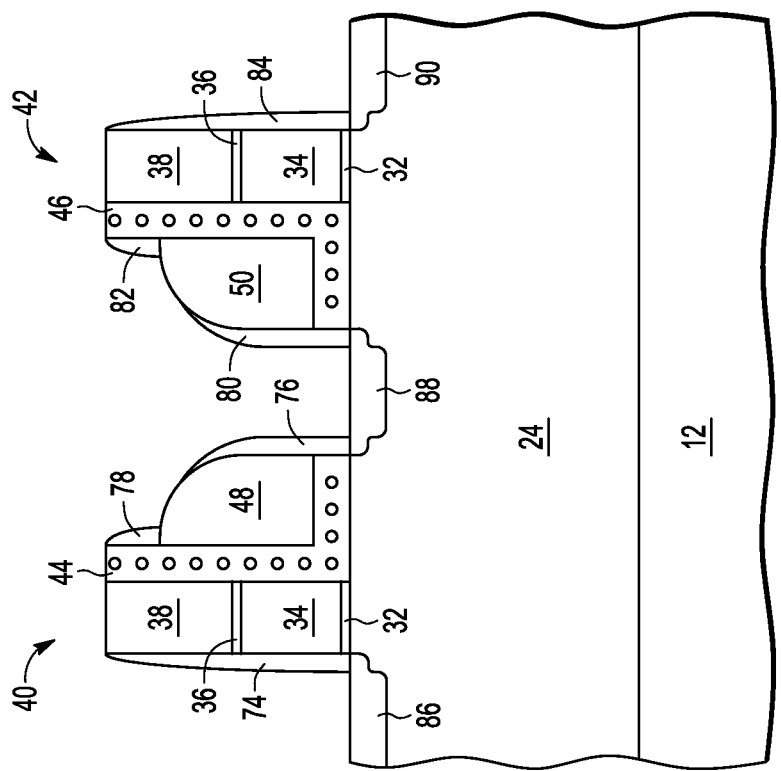
FIG. 12 is a different cross section of a non-volatile memory cell and a gate last transistor of FIG. 11.

Shown in FIG. 12 is semiconductor device 10 at cross section 12-12 of FIG. 11. During this time, sidewall spacers 74, 76, 78, 80, 82, and 84 and source/drain regions 86, 88, and 90 are formed relative to select gates 40 and 42 and control gates 48 and 50, which are shown in FIG. 12.

Figure 13:
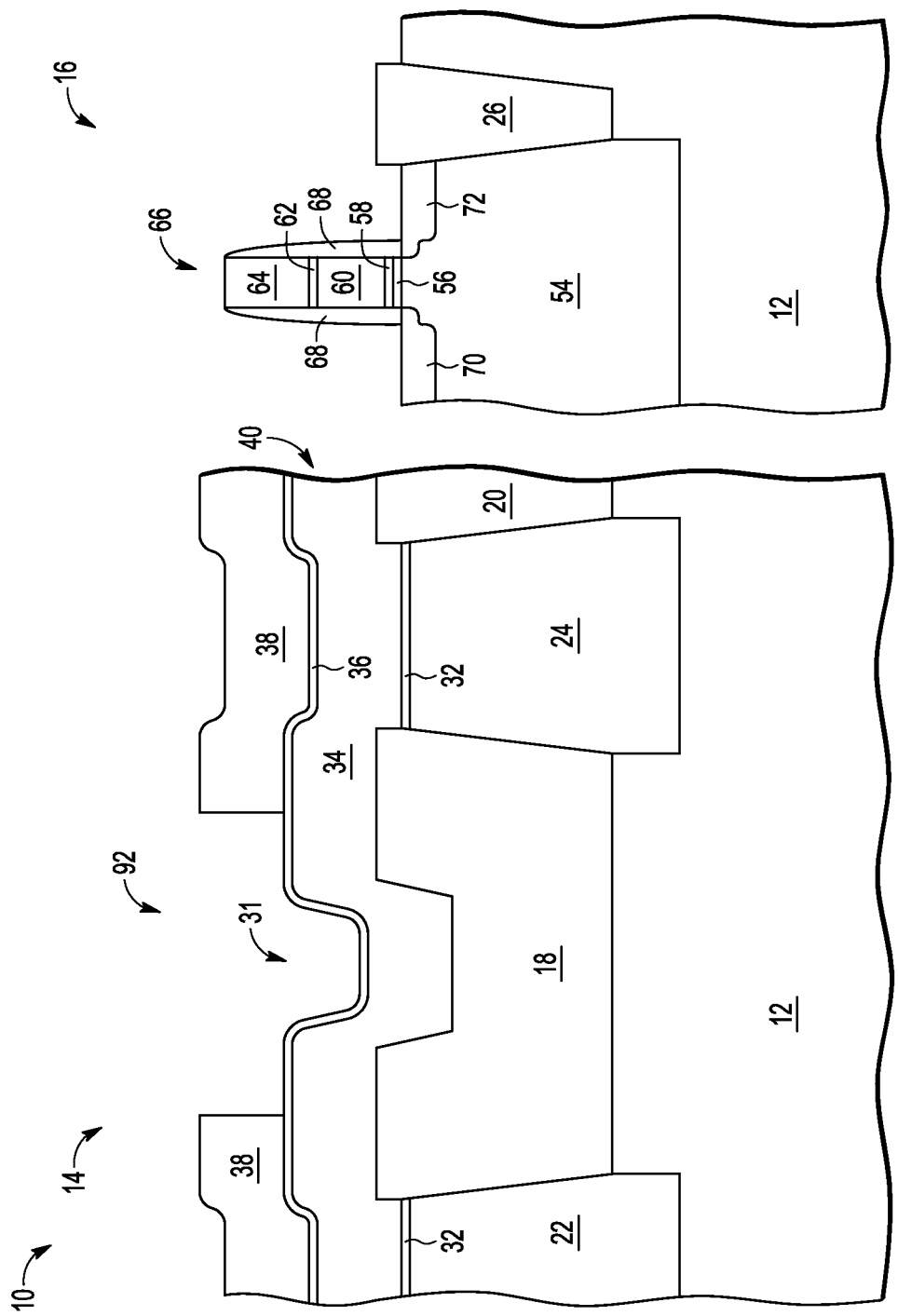
FIG. 13 is a cross section of a non-volatile memory cell and a gate last transistor of FIG. 12 at a subsequent stage in processing.

Shown in FIG. 13 is semiconductor device 10 after nitride layer 38 has been pattern etched to leave an opening 92 that is wider than opening 31. Opening 92 is bounded by sidewalls of nitride layer 38.

Figure 14:
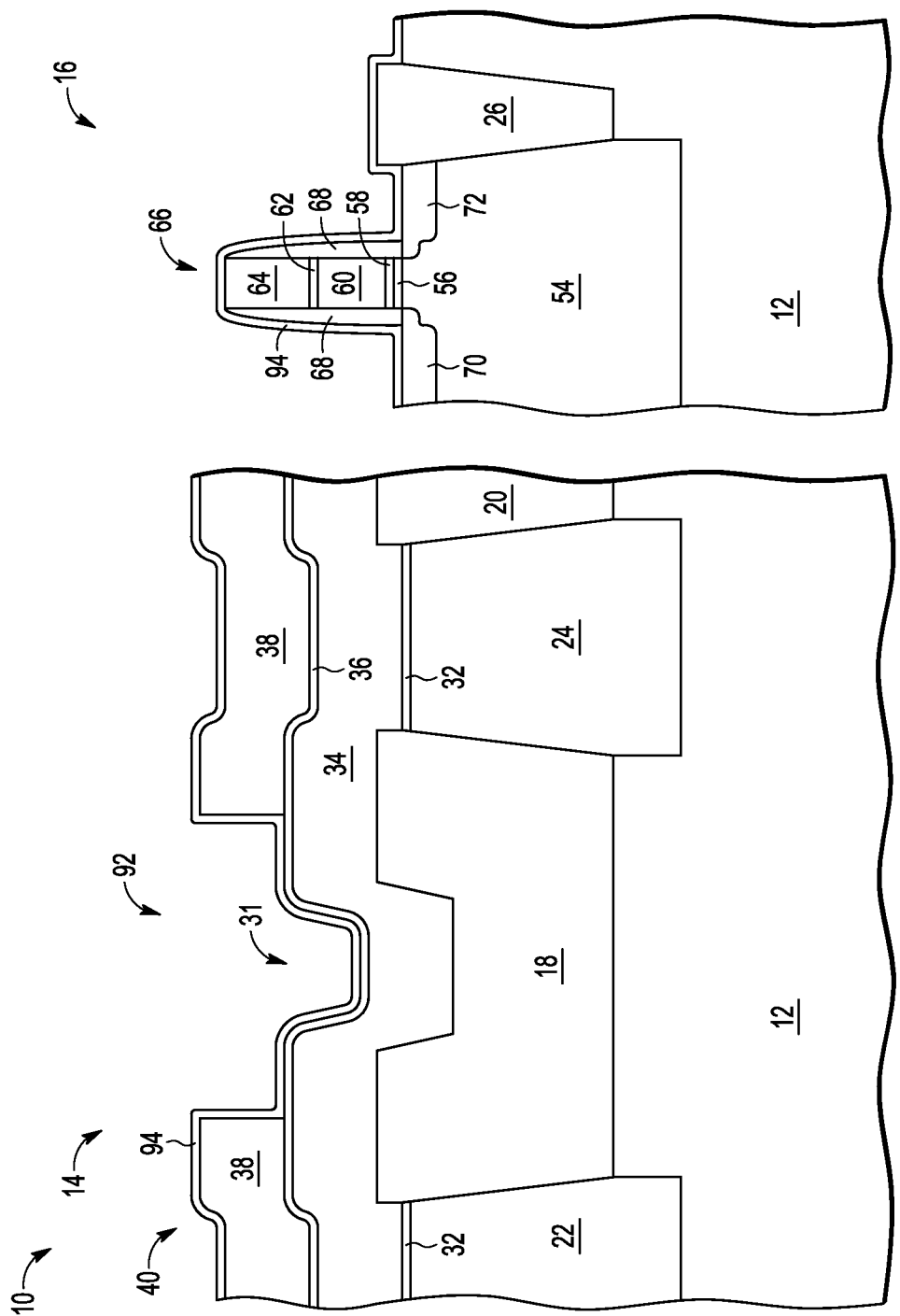
FIG. 14 is a cross section of a non-volatile memory cell and a gate last transistor of FIG. 13 at a subsequent stage in processing.

Shown in FIG. 14 is semiconductor device 10 after forming a liner 94 over NVM region 14 and logic region 16. Liner 94 is commonly used, prior to performing a silicidation process, to protect certain areas such as ESD protection circuits and other exposed silicon areas that are not to be silicided.

Figure 15:
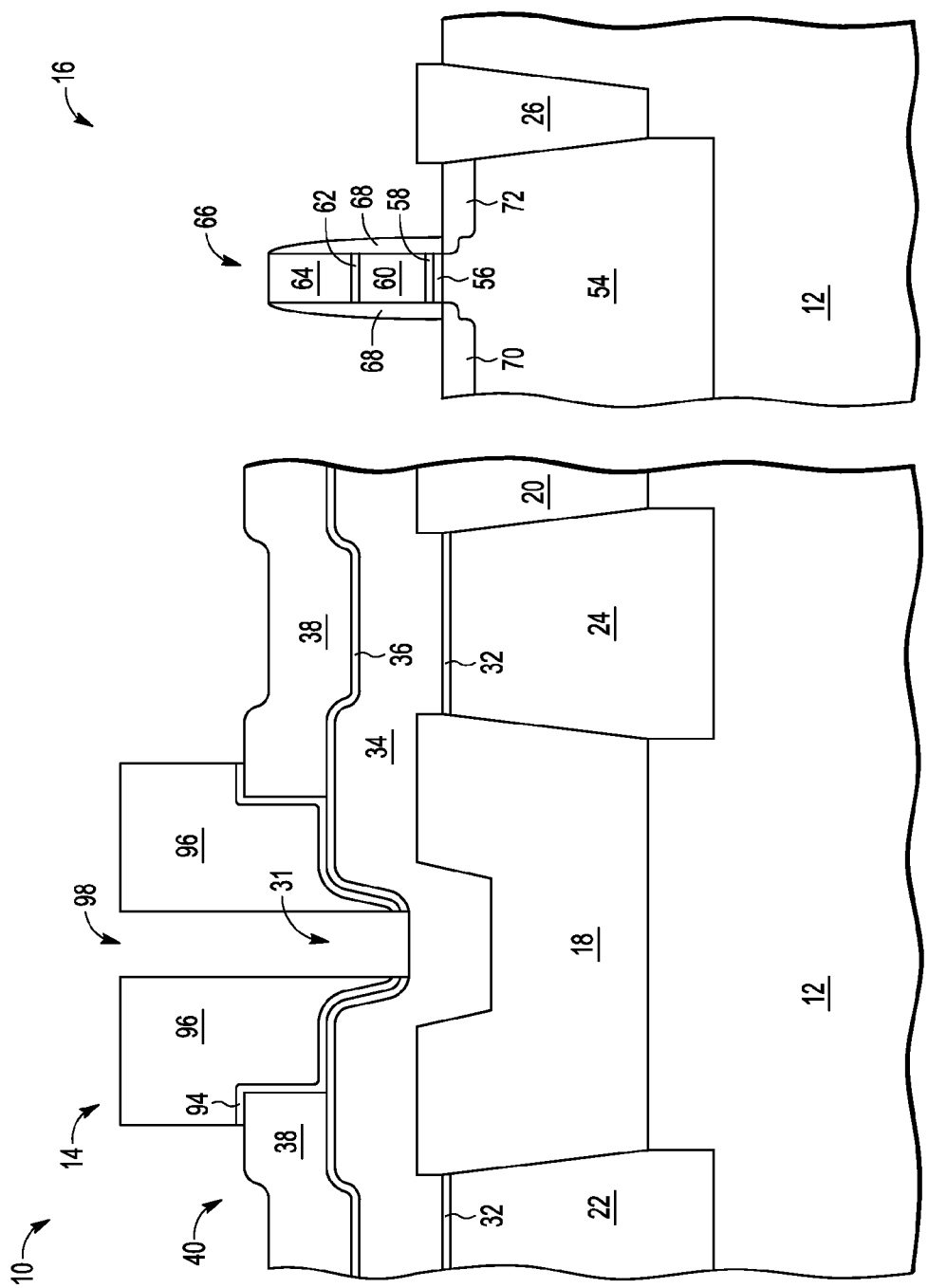
FIG. 15 is a cross section of a non-volatile memory cell and a gate last transistor of FIG. 14 at a subsequent stage in processing.

Shown in FIG. 15 is semiconductor device 10 after forming a patterned photoresist layer 96 that has an opening 98 aligned to opening 31 and after performing an etch of layers 36 and 94 and thereby exposing a center portion of opening 31. Patterned photoresist layer 96 extends to cover the sidewalls of nitride layer and extends slightly past the sidewalls. The etch that exposes the center portion of opening 31 also removes liner 94 from the top surface of nitride layer 38 not covered by patterned photoresist layer 96 and from logic region 16. The result is that silicon that is exposed in FIG. 15 is polysilicon layer 34 at opening 98 and source/drains 70 and 72.

Figure 16:
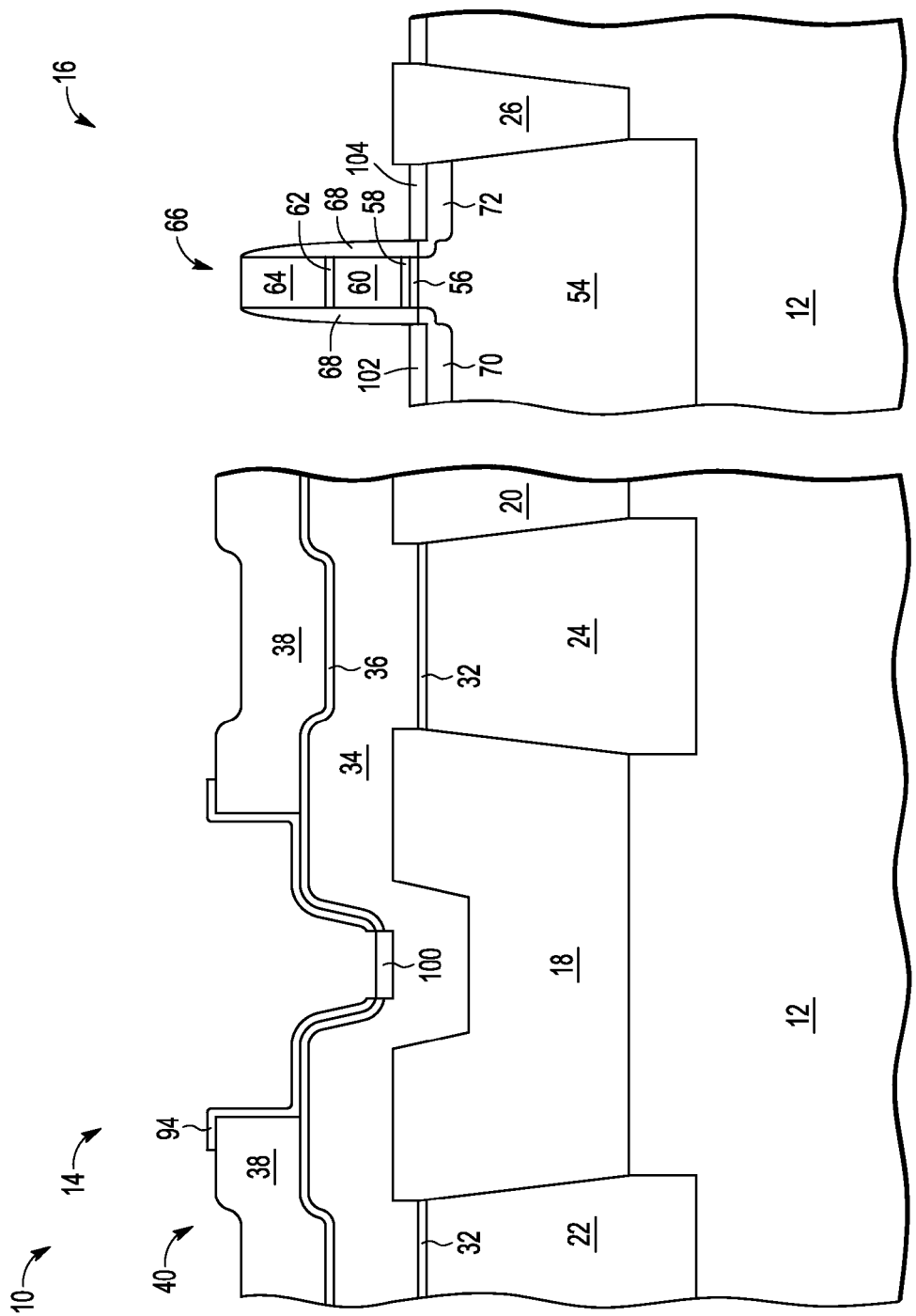
FIG. 16 is a cross section of a non-volatile memory cell and a gate last transistor of FIG. 15 at a subsequent stage in processing.

Shown in FIG. 16 is semiconductor device 10 after performing silicidation which results in silicide region 100 formed at opening 98, silicide region 102 at source/drain 70, and silicide region 104 at source/drain region 72.

Figure 17:
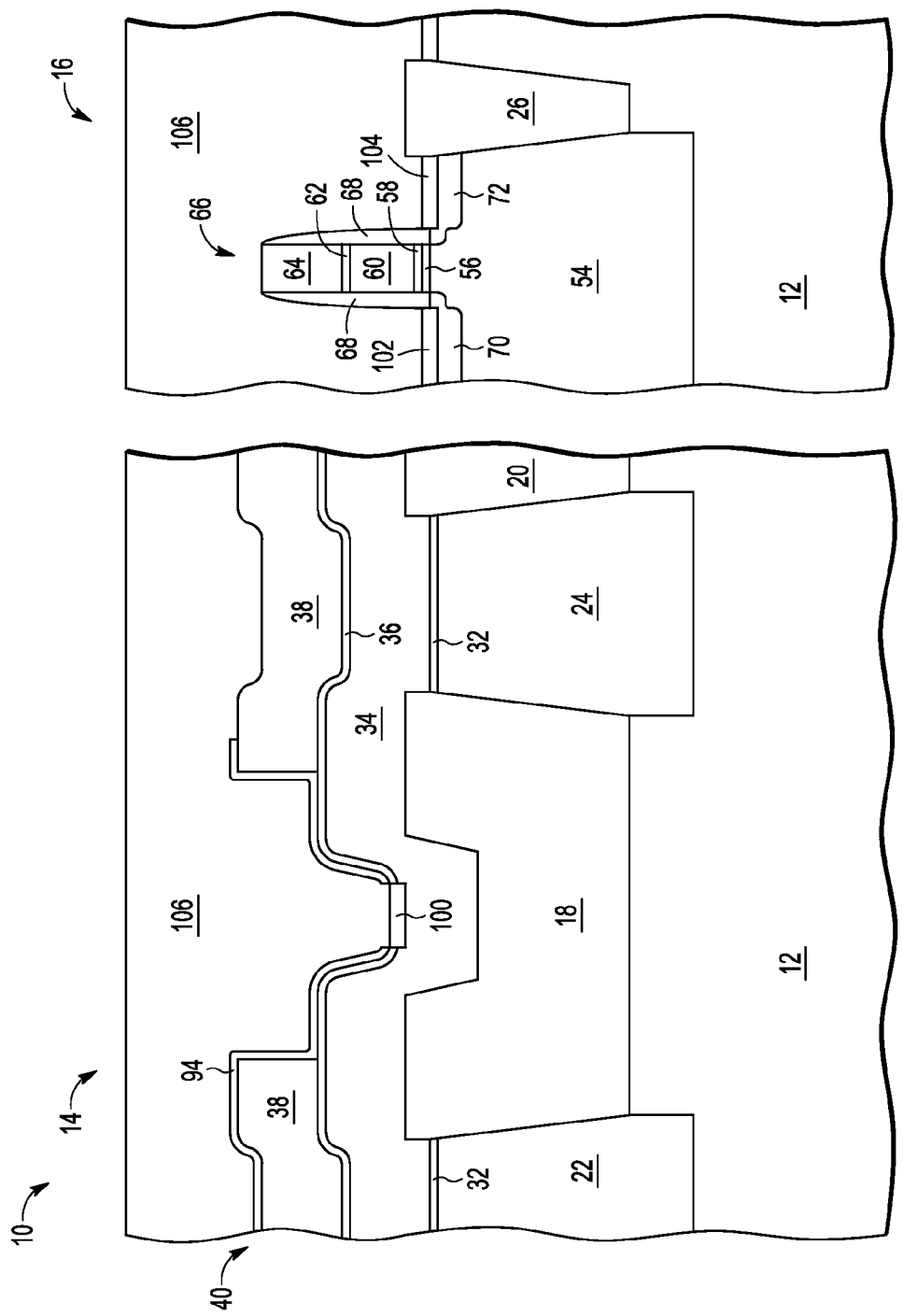
FIG. 17 is a cross section of a non-volatile memory cell and a gate last transistor of FIG. 16 at a subsequent stage in processing.

Shown in FIG. 17 is semiconductor device 10 after depositing a layer 106 of oxide, which may be multiple layers and may include thin layers that are not oxide, which is useful as an interlayer dielectric (ILD).

Figure 18:
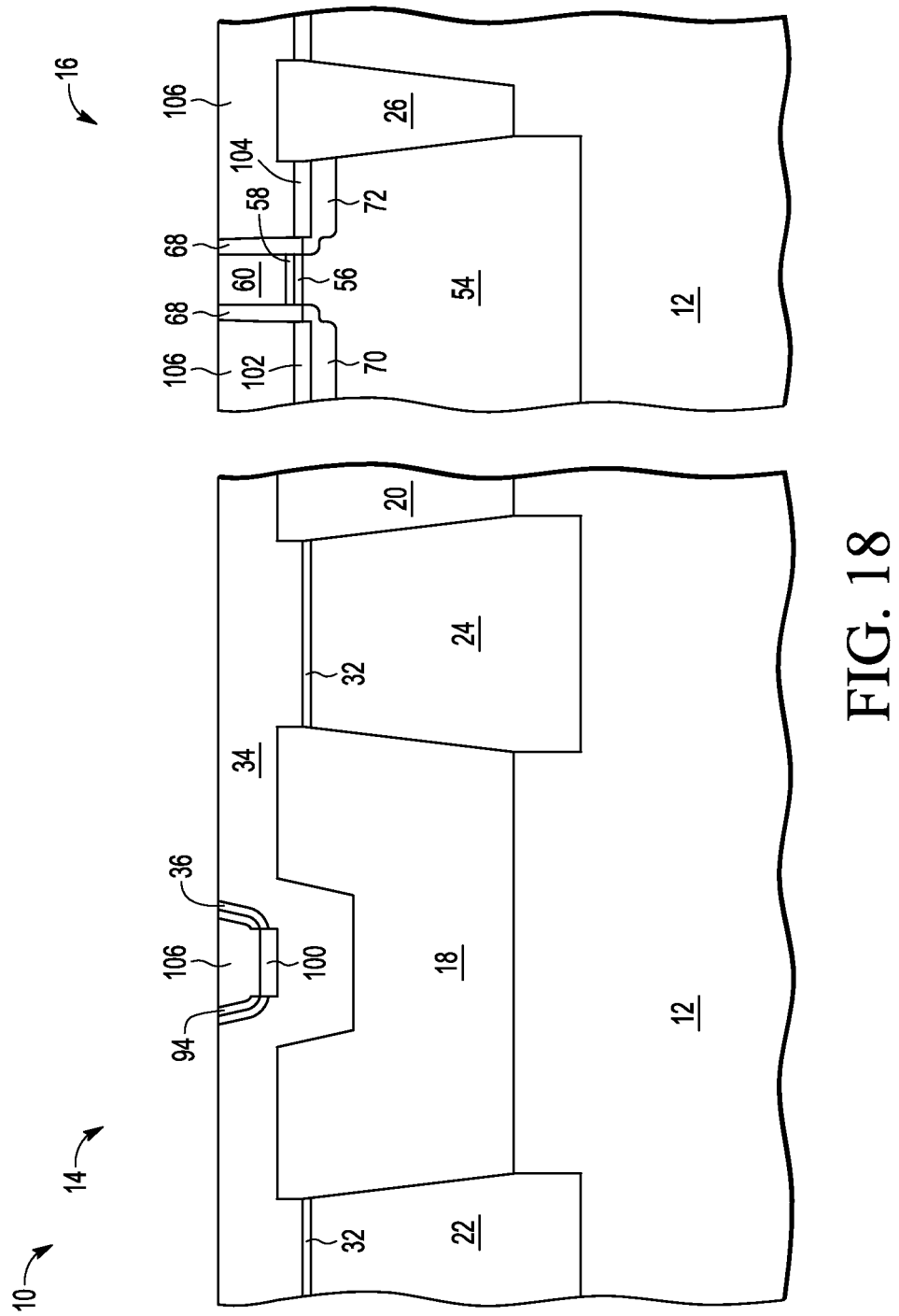
FIG. 18 is a cross section of a non-volatile memory cell and a gate last transistor of FIG. 17 at a subsequent stage in processing.

Shown in FIG. 18 is semiconductor device 10 after performing CMP that lowers the top surface of semiconductor device down to a little below oxide layer 62. This leaves the portion of polysilicon layer 60 that may be considered dummy gate 60. This also leaves the remaining top surface of polysilicon layer 34 above silicide region 100. The result is that a small portion of layer 106 is over silicide region 100. Polysilicon layer 106 is also over silicide regions 102 and 104.

Figure 19:
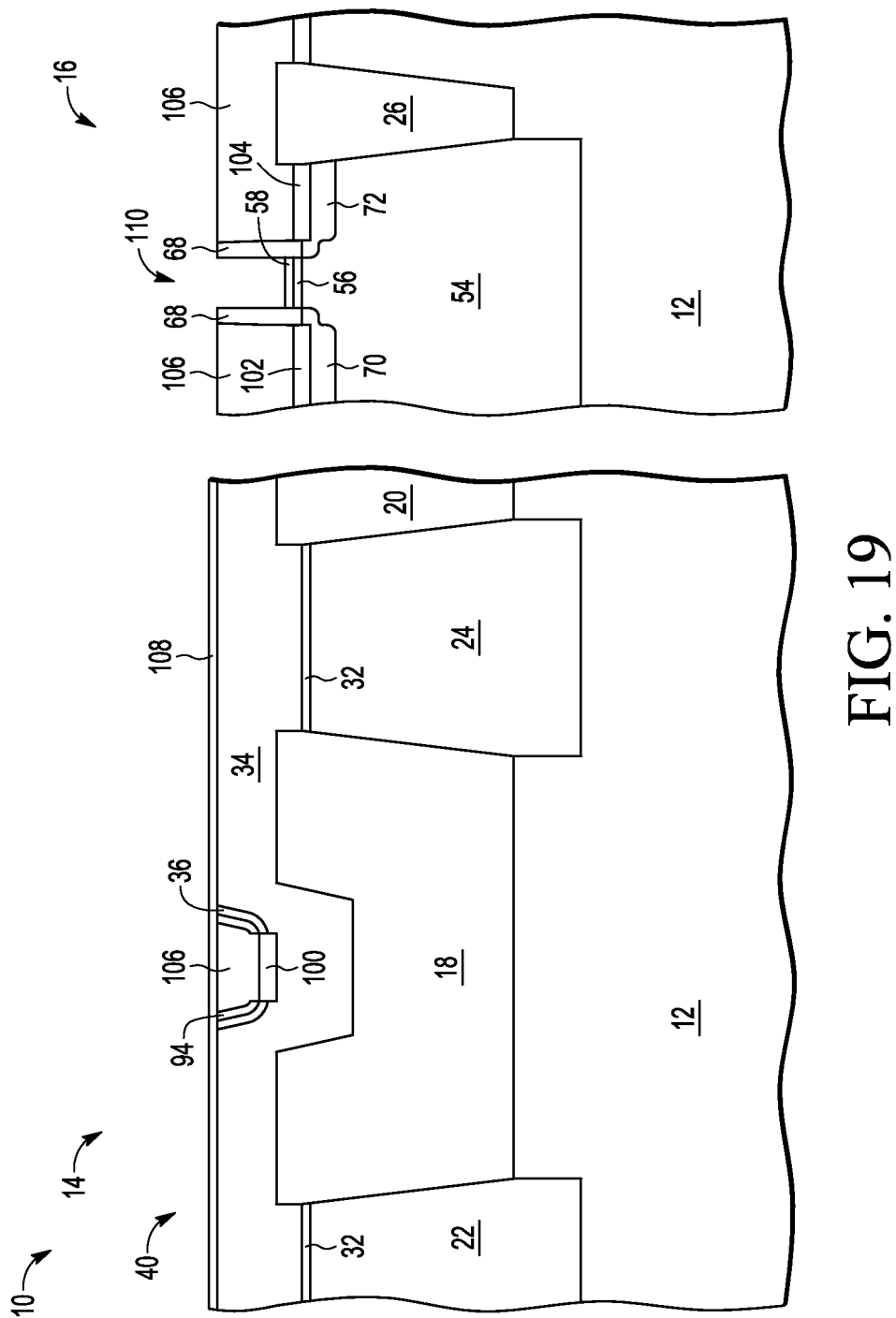
FIG. 19 is a cross section of a non-volatile memory cell and a gate last transistor of FIG. 18 at a subsequent stage in processing.

Shown in FIG. 19 is semiconductor device 10 after forming a dielectric layer 108, which may be oxide, over NVM region 14 and then removing dummy gate 60 to leave an opening 110.

Figure 20:
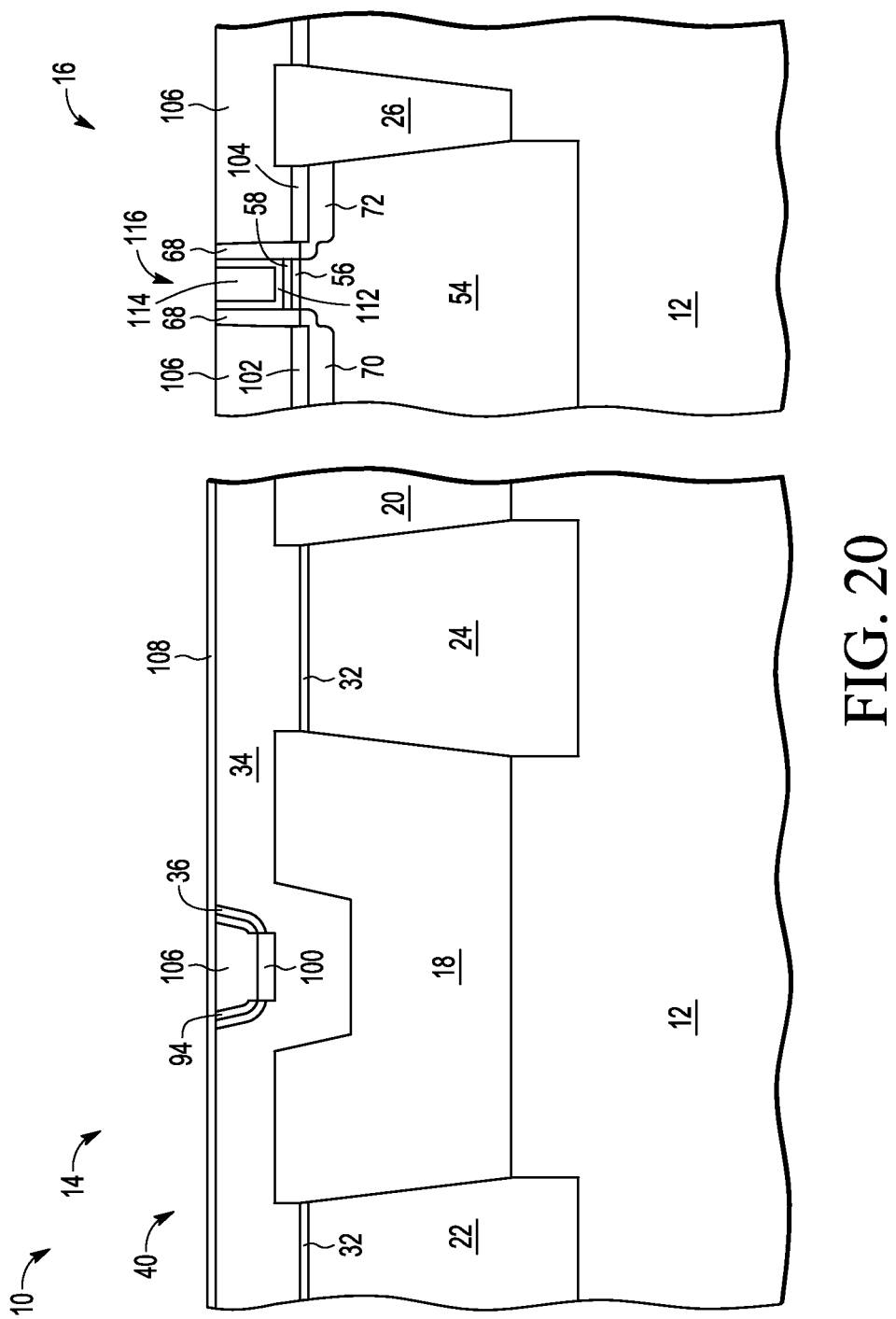
FIG. 20 is a cross section of a non-volatile memory cell and a gate last transistor of FIG. 19 at a subsequent stage in processing.

Shown in FIG. 20 is semiconductor device 10 after forming a work function setting metal layer 112 in opening 110, then filling opening 110 with a conductive fill 114, containing metal. Conductive fill 114 may be all metal such as aluminum, a doped metal, or a composite that includes metal. A CMP step provides for removal of conductive fill 114 and work function setting metal layer 112 outside of opening 110. The combination of barrier layer 58, work function setting metal layer 112, and conductive fill 114 result in metal gate stack 116. It may be desirable to form an etch stop layer over NVM region 14 after the CMP step.

Figure 21:
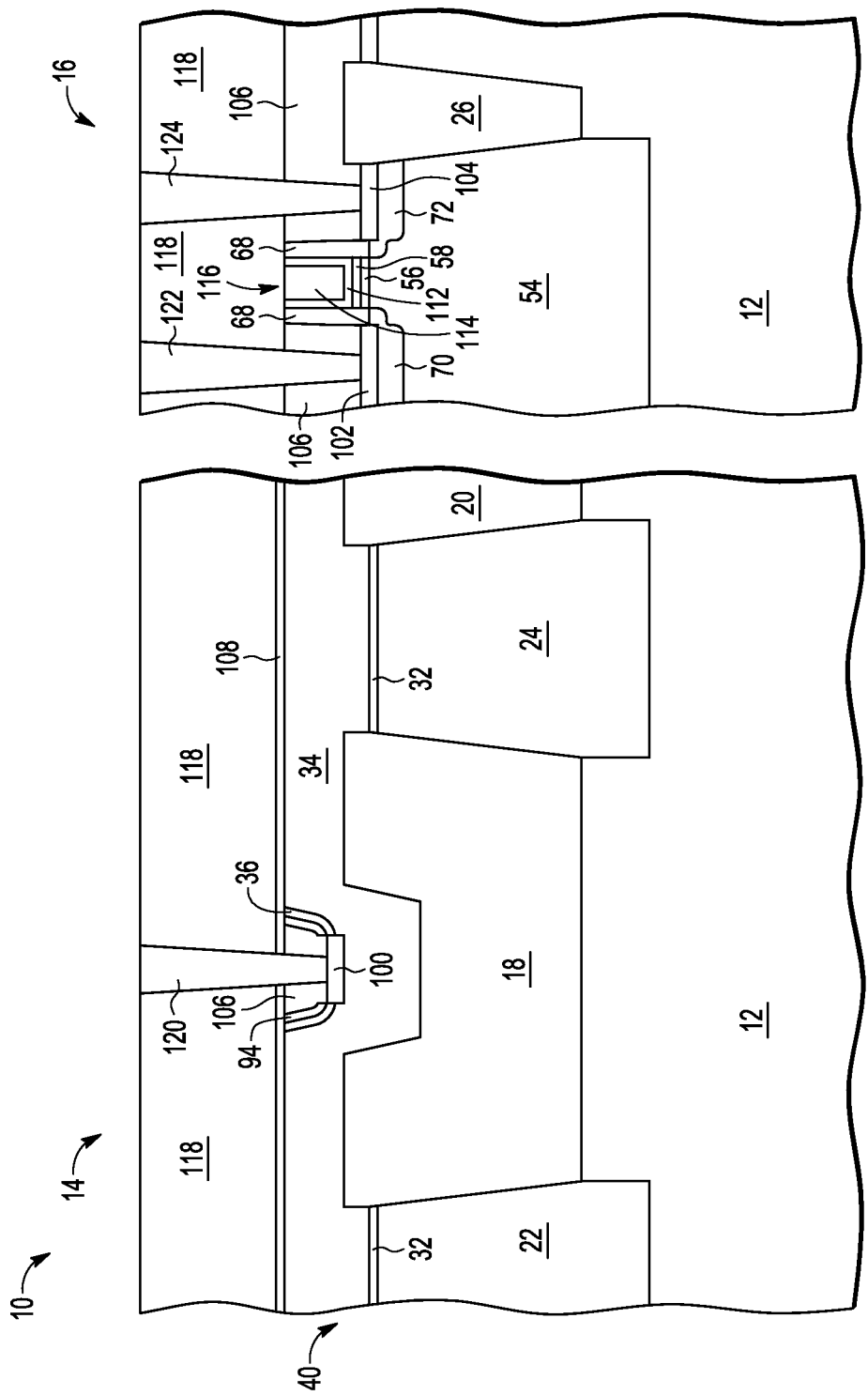
FIG. 21 is a cross section of a non-volatile memory cell and a gate last transistor of FIG. 20 at a subsequent stage in processing.

Shown in FIG. 21 is semiconductor device 10 after forming an ILD layer 118 over NVM region 14 and logic region 16, a via 120 through ILD layer 118, dielectric layer 108 and polysilicon layer 106 to contact silicide region 100 that can be used as a strap between a word line and the select gates running along the word line, a via 122 through ILD layer 118 and polysilicon layer 106 to silicide region 102, and a via 124 through ILD 118 and layer 106 to silicide region 104.

As shown, an integration of logic and NVM is efficiently achieved using a gate last process that utilizes for CMP to achieve a transistor gate while maintaining the ability to provide desired strapping to a silicide between the word line and the select gate.

By now it should be appreciated that there has been provided a method of making a semiconductor structure using a substrate in which the semiconductor structure includes a split gate non-volatile memory (NVM) cell in an NVM region of the substrate. The method includes etching a recess into an isolation region of the substrate in the NVM region. The method includes depositing a polysilicon layer over the substrate, including over the recess. The method includes depositing a nitride layer over the polysilicon layer. The method includes forming a polysilicon select gate and a polysilicon control gate in the NVM region. The method includes forming a polysilicon gate in a logic region of the substrate. The method includes removing a portion of the nitride layer over the recess. The method includes depositing a salicide block bi-layer over the substrate, including over the recess. The method includes patterning the salicide block bi-layer to form a first opening in the salicide block bi-layer that exposes a contact portion of the polysilicon layer over the recess. The method includes forming a silicided region on the contact portion of the polysilicon layer over the recess within the first opening. The method includes planarizing the substrate to expose the polysilicon gate. The method includes replacing the polysilicon gate with a metal gate. The method includes depositing a first interlayer dielectric over the substrate. The method includes etching a second opening through the first interlayer dielectric to the silicided region. The method includes depositing contact metal into the second opening. The method may further include forming an oxide layer over the polysilicon layer before the depositing the nitride layer over the polysilicon layer. The method may further include forming a hard mask over the NVM region, including over the polysilicon select gate and the polysilicon control gate, subsequent to the forming the polysilicon select gate and the polysilicon control gate in the NVM region. The method may have a further characterization by which the forming the polysilicon gate in the logic region further include forming a dummy stack that includes the polysilicon gate in the logic region of the substrate, subsequent to the forming the hard mask over the NVM region. The method may further include forming sidewall spacers and source/drain regions around the dummy stack that includes the polysilicon gate, the polysilicon select gate, and the polysilicon control gate. The method may have a further characterization by which the patterning the salicide block bi-layer further includes forming a photoresist over the salicide block bi-layer, the photoresist having the first opening that exposes the contact portion of the polysilicon layer over the recess and removing the salicide block bi-layer that is not under the photoresist to expose the nitride layer outside of the recess and the contact portion of the polysilicon layer over the recess. The method may further include depositing a second interlayer dielectric over the substrate, including over the recess, subsequent to the forming the silicided region. The method may have a further characterization by which the second interlayer dielectric comprises a second nitride layer over the silicided region and the second nitride layer provides an etch stop during the planarizing the substrate. The method may further include forming an oxide layer over the substrate in the NVM region, subsequent to the planarizing the substrate. The method may have a further characterization by which a remaining portion of the second interlayer dielectric remains over the silicided region subsequent to the planarizing the substrate and the oxide layer is formed over the substrate, including over the remaining portion of the second interlayer dielectric. The method may have a further characterization by which the etching the second opening further includes etching the second opening through the first interlayer dielectric, the oxide layer, and the remaining portion of the second interlayer dielectric to the silicided region. The method may have a further characterization by which the salicide block bi-layer comprises an oxide-nitride layer. The method may have a further characterization by which the contact metal comprises one or more metal layers. The method may have a further characterization by which the dummy stack includes a high-k dielectric layer.

Also disclosed is a method of making a semiconductor structure using a substrate, wherein the semiconductor structure comprises a split gate non-volatile memory (NVM) cell in an NVM region of the substrate. The method includes etching a recess into an isolation region of the substrate in the NVM region. The method further includes depositing a conductive layer over the substrate, including over the recess. The method further includes depositing a capping layer over the conductive layer. The method further includes forming a select gate and a control gate in the NVM region, the select gate and the control gate each including a portion of the conductive layer. The method further includes forming a dummy gate in a logic region of the substrate. The method further includes removing a portion of the capping layer over the recess. The method further includes depositing a salicide block bi-layer over the substrate, including over the recess. The method further includes patterning the salicide block bi-layer to form a first opening in the salicide block bi-layer that exposes a contact portion of the conductive layer over the recess. The method further includes forming a silicided region on the contact portion of the conductive layer over the recess within the first opening. The method further includes planarizing the substrate to expose the dummy gate. The method further includes depositing a first interlayer dielectric over the substrate. The method further includes etching a second opening through the first interlayer dielectric to the silicided region. The method further includes depositing contact metal into the second opening. The method may have a further characterization by which during the forming the dummy gate, a high-k dielectric layer is formed under the dummy gate, the high-k dielectric layer remains under the metal gate subsequent to the replacing the dummy gate with the metal gate, and the metal gate comprises one or more metal layers. The method may have a further characterization by which the contact metal comprises one or more metal layers.

Disclosed also is a semiconductor structure using a substrate having a non-volatile memory (NVM) region and a logic region. The semiconductor structure includes a split gate NVM cell in the NVM region, the split gate NVM cell. The split gate NVM cell includes a polysilicon select gate and a polysilicon control gate. The semiconductor structure further includes a contact electrode in an isolation region of the substrate in the NVM region, the contact electrode being over a recess into the isolation region, the contact electrode comprising a silicided region on a contact portion of a polysilicon layer over the recess. The semiconductor structure further includes a metal gate stack in the logic region. The semiconductor structure may have a further characterization by which the metal gate stack includes a high-k dielectric layer over the substrate and one or more metal layers. The semiconductor structure may have a further characterization by which the contact electrode further includes contact metal that comprises one or more metal layers.

Although the invention is described herein with reference to specific embodiments, various modifications and changes can be made without departing from the scope of the present invention as set forth in the claims below. For example, other combinations of materials for the various purposes of conductivity, dielectric properties, and replaced materials than those described may be effective. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of making a semiconductor structure using a substrate, wherein the semiconductor structure comprises a split gate non-volatile memory (NVM) cell in an NVM region of the substrate, the method comprising:
    etching a recess into an isolation region of the substrate in the NVM region;
    depositing a polysilicon layer over the substrate, including over the recess;
    depositing a nitride layer over the polysilicon layer;
    forming a polysilicon select gate and a polysilicon control gate in the NVM region;
    forming a polysilicon gate in a logic region of the substrate;
    removing a portion of the nitride layer over the recess;
    depositing a salicide block bi-layer over the substrate, including over the recess;
    patterning the salicide block bi-layer to form a first opening in the salicide block bi-layer that exposes a contact portion of the polysilicon layer over the recess;
    forming a silicided region on the contact portion of the polysilicon layer over the recess within the first opening;
    planarizing the substrate to expose the polysilicon gate;
    replacing the polysilicon gate with a metal gate;
    depositing a first interlayer dielectric over the substrate;
    etching a second opening through the first interlayer dielectric to the silicided region; and
    depositing contact metal into the second opening.

2. The method of claim 1, further comprising:
    forming an oxide layer over the polysilicon layer before the depositing the nitride layer over the polysilicon layer.

3. The method of claim 1, further comprising:
    forming a hard mask over the NVM region, including over the polysilicon select gate and the polysilicon control gate, subsequent to the forming the polysilicon select gate and the polysilicon control gate in the NVM region.

4. The method of claim 3, wherein the forming the polysilicon gate in the logic region further comprises:
    forming a dummy stack that includes the polysilicon gate in the logic region of the substrate, subsequent to the forming the hard mask over the NVM region.

5. The method of claim 4, further comprising:
    forming sidewall spacers and source/drain regions around the dummy stack that includes the polysilicon gate, the polysilicon select gate, and the polysilicon control gate.

6. The method of claim 1, wherein
    the contact metal comprises one or more metal layers.

7. The method of claim 1, wherein the patterning the salicide block bi-layer further comprises:
    forming a photoresist over the salicide block bi-layer, the photoresist having the first opening that exposes the contact portion of the polysilicon layer over the recess; and
    removing the salicide block bi-layer that is not under the photoresist to expose the nitride layer outside of the recess and the contact portion of the polysilicon layer over the recess.

8. The method of claim 1, further comprising:
    depositing a second interlayer dielectric over the substrate, including over the recess, subsequent to the forming the silicided region.

9. The method of claim 8, wherein
    the second interlayer dielectric comprises a second nitride layer over the silicided region, and
    the second nitride layer provides an etch stop during the planarizing the substrate.

10. The method of claim 8, further comprising:
forming an oxide layer over the substrate in the NVM region, subsequent to the planarizing the substrate.

11. The method of claim 10, wherein
a remaining portion of the second interlayer dielectric remains over the silicided region subsequent to the planarizing the substrate, and
the oxide layer is formed over the substrate, including over the remaining portion of the second interlayer dielectric.

12. The method of claim 11, wherein the etching the second opening further comprises:
etching the second opening through the first interlayer dielectric, the oxide layer, and the remaining portion of the second interlayer dielectric to the silicided region.

13. The method of claim 1, wherein
the salicide block bi-layer comprises an oxide-nitride layer.

14. The method of claim 4, wherein
the dummy stack includes a high-k dielectric layer.

15. A method of making a semiconductor structure using a substrate, wherein the semiconductor structure comprises a split gate non-volatile memory (NVM) cell in an NVM region of the substrate, the method comprising:
etching a recess into an isolation region of the substrate in the NVM region;
depositing a conductive layer over the substrate, including over the recess;
depositing a capping layer over the conductive layer;
forming a select gate and a control gate in the NVM region, the select gate and the control gate each including a portion of the conductive layer;
forming a dummy gate in a logic region of the substrate;
removing a portion of the capping layer over the recess;
depositing a salicide block bi-layer over the substrate, including over the recess;
patterning the salicide block bi-layer to form a first opening in the salicide block bi-layer that exposes a contact portion of the conductive layer over the recess;
forming a silicided region on the contact portion of the conductive layer over the recess within the first opening;
planarizing the substrate to expose the dummy gate;
replacing the dummy gate with a metal gate;
depositing a first interlayer dielectric over the substrate;
etching a second opening through the first interlayer dielectric to the silicided region; and
depositing contact metal into the second opening.

16. The method of claim 15, wherein
during the forming the dummy gate, a high-k dielectric layer is formed under the dummy gate,
the high-k dielectric layer remains under the metal gate subsequent to the replacing the dummy gate with the metal gate, and
the metal gate comprises one or more metal layers.

17. The method of claim 15, wherein
the contact metal comprises one or more metal layers.

18. A semiconductor structure using a substrate having a non-volatile memory (NVM) region and a logic region, comprising:
a split gate NVM cell in the NVM region, the split gate NVM cell comprising:
a polysilicon select gate, and
a polysilicon control gate;
a contact electrode in an isolation region of the substrate in the NVM region, the contact electrode being over a recess into the isolation region, the contact electrode comprising a silicided region on a contact portion of a polysilicon layer over the recess; and
a metal gate stack in the logic region.

19. The semiconductor structure of claim 18, wherein
the metal gate stack includes a high-k dielectric layer over the substrate and one or more metal layers.

20. The semiconductor structure of claim 18, wherein
the contact electrode further includes contact metal that comprises one or more metal layers.

* * * * *